United States Patent [19]

Grover et al.

[11] 4,157,495
[45] Jun. 5, 1979

[54] NUCLEAR MAGNETIC RESONANCE GYRO

[75] Inventors: Bruce C. Grover, Thousand Oaks; Edward Kanegsberg, Pacific Palisades; John G. Mark, Pasadena; Roger L. Meyer, Canoga Park, all of Calif.

[73] Assignee: Litton Systems, Inc., Woodland Hills, Calif.

[21] Appl. No.: 842,368

[22] Filed: Oct. 14, 1977

Related U.S. Application Data

[63] Continuation of Ser. No. 714,978, Aug. 14, 1976, abandoned.

[51] Int. Cl.² ............................................. G01R 33/08
[52] U.S. Cl. .............................. 324/0.5 F; 324/0.5 R; 324/0.5 A

[58] Field of Search .............. 324/0.5 R, 0.5 F, 0.5 A; 331/94.5 H

[56] References Cited

U.S. PATENT DOCUMENTS 4,005,355  1/1977  Happer .............................. 324/0.5 F

*Primary Examiner*—M. Tokar
*Attorney, Agent, or Firm*—Harold E. Gillmann; Ernest L. Brown

[57] ABSTRACT

A nuclear magnetic resonance gyroscope is disclosed that operates on the principle of sensing angular rotation rate as a shift in the Larmor frequency of one or more nuclear species that possess nuclear magnetic moments.

66 Claims, 6 Drawing Figures

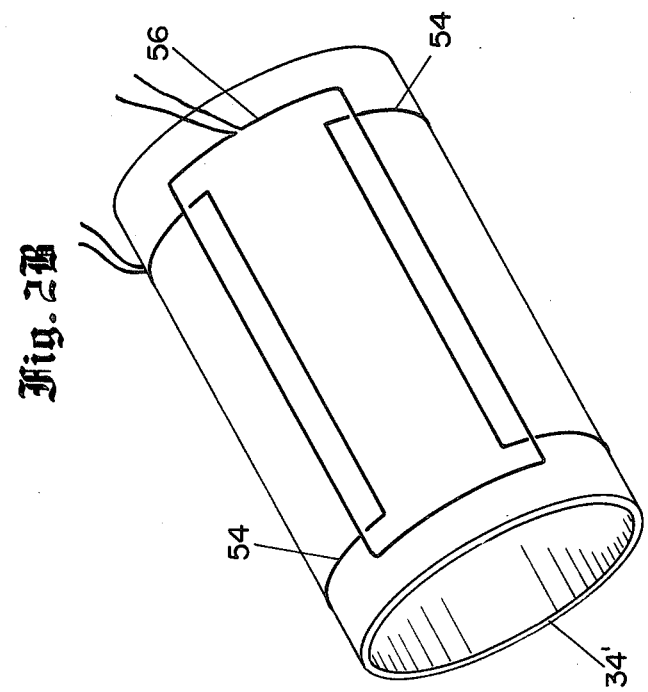
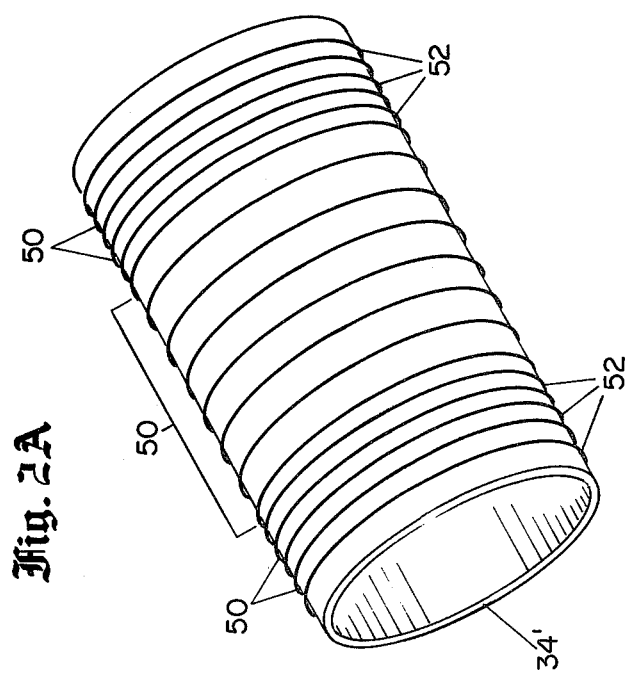

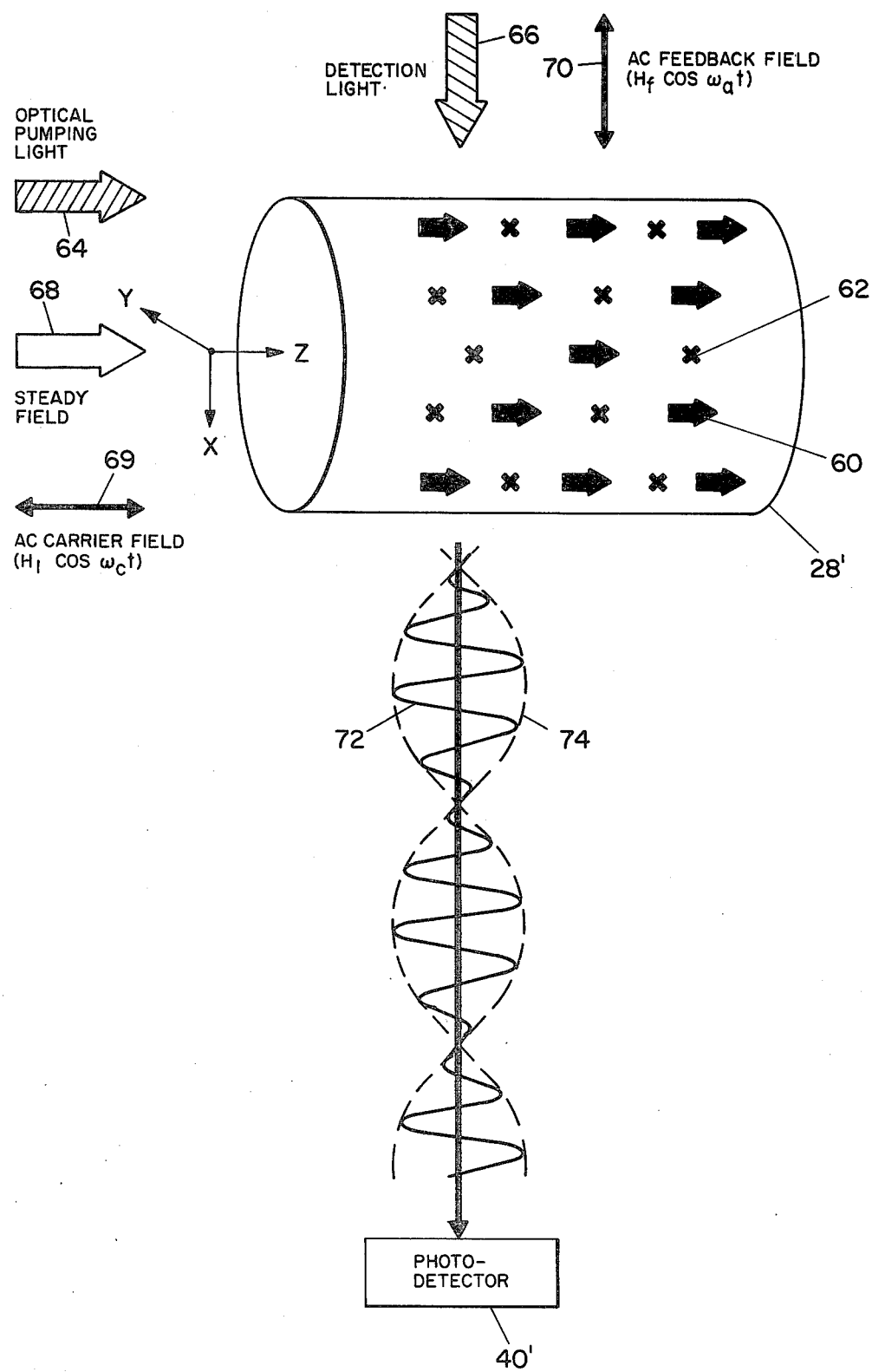

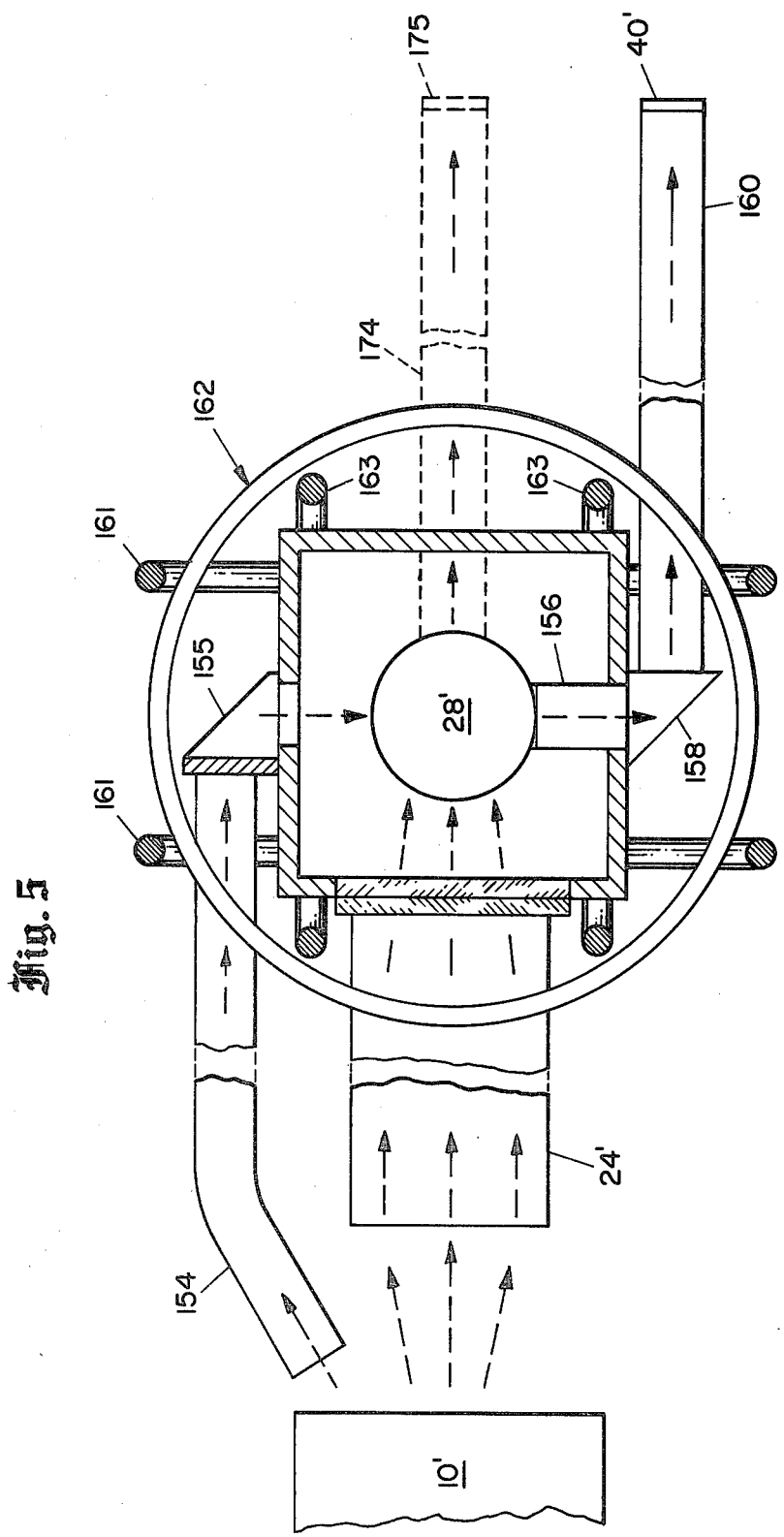

NUCLEAR MAGNETIC RESONANCE GYRO

CROSS-REFERENCE TO A RELATED APPLICATION

This is a continuation of Application Ser. No. 714,978 filed Aug. 14, 1976, now abandoned.

BACKGROUND OF THE INVENTION

This invention relates to the creation and detection of nuclear magnetic resonance. More particularly this invention relates to the application of nuclear magnetic resonance to a gyroscope.

A number of approaches have been suggested in the prior art for implementing the basic concept of a nuclear magnetic resonance NMR gyroscope. In general, they utilize a nuclear magnetic resonance controlled oscillator and derive rotational information from the phases of the nuclear moment Larmor precession signals by means of suitable phase comparison and magnetic field control circuitry.

In general, these devices contain significant deficiencies which limit the development of a useful instrument. For instance, such devices have been limited by relatively short relaxation times of the gases which have been employed. Also, the strong direct coupling between these gases and the light which is employed as the means of magnetic moment alignment or magnetic moment detection can limit both the relaxation times and the signal-to-noise ratio, and therefore can also limit the potential usefulness of such instruments.

SUMMARY OF THE INVENTION

A nuclear magnetic resonance (hereinafter referred to as "NMR") gyroscope is disclosed that operates on the principle of sensing inertial angular rotation rate or angular displacement about a sensitive axis of the device as a shift in the Larmor precession frequency or phase, respectively, of one or more isotopes that possess nuclear magnetic moments. The gyroscope is composed of an angular rotation sensor and associated electronics. The principal elements of the sensor are a light source, an NMR cell, a photodetector, a set of magnetic shields and a set of magnetic field coils. The principal elements of the electronics are signal processing circuits for extracting the Larmor precession frequency and phase information as well as circuits for generating and controlling various magnetic fields, both steady and varying sinusoidally with time, that are necessary for the proper operation of the device.

The NMR cell is mounted within a set of magnetic shields in order to attenuate external magnetic fields to acceptably low levels. Magnetic field coils are used to apply very uniform magnetic fields to the NMR cell. Both a steady field and an AC carrier field are applied along the sensitive axis of the device and AC feedback fields are applied along one of the transverse axes. The DC magnetic fields along both transverse axes are controlled to be virtually zero. The NMR cell contains an alkali metal vapor, such as rubidium, together with two isotopes of one or more noble gases, such as krypton-83 and xenon-129. A buffer gas such as helium may also be contained in the cell.

The NMR cell is illuminated by a beam of circularly polarized light that originates from a source such as a rubidium lamp and which passes through the cell at an angle with respect to the steady magnetic field. Absorption of some of this light causes the atomic magnetic moments of the rubidium atoms to be partially aligned in the direction of the steady magnetic field. This alignment is partially transferred to the nuclear magnetic moments of the noble gases and these moments are caused to precess about the direction of the steady magnetic field, which in turn creates magnetic fields that rotate at the respective Larmor precession frequencies of the two noble gases. These rotating fields modulate the precessional motions of the rubidium magnetic moments, which in turn produces corresponding modulations of the transmitted light, thereby making it possible to optically detect the Larmor precession frequencies of the two noble gases.

The modulations of the light intensity are converted into electrical signals by a photodetector and these signals are then electronically demodulated and filtered to provide signals at the Larmor precession frequencies of the two noble gases. The difference between the two precession frequencies is used to accurately control the steady magnetic field so that it is constant. One of the noble gas precession frequencies is compared to a precision reference frequency and the resulting difference frequency is the angular rotation rate of the gyroscope.

The two detected noble gas precession signals are also used to generate two AC feedback magnetic fields at the Larmor precession frequencies of the noble gases, and these are responsible for sustaining the precession of the nuclear magnetic moments of the noble gases. The use of an AC carrier magnetic field facilitates the optical detection of the precessing noble gas moments as well as providing means for controlling the DC magnetic fields along the two transverse axes of the gyroscope.

According to the invention, the NMR gyroscope includes the means for the simultaneous alignment of the nuclear magnetic moments of at least two nuclear moment gases, thereby constituting a nuclear magnetic moment alignment device; the means for achieving sustained precession of these moments, thereby constituting a nuclear magnetic resonance oscillator capable of sustained oscillations; the means for the optical detection of these precessing nuclear moments, thereby constituting a nuclear magnetic resonance detection device; the means for accurately controlling the internal magnetic field of the device; and the means for the accurate measurement of the frequency or phase of the detected nuclear moment precession signal of at least one of the nuclear moment gases to provide a measurement of the angular rotation rate or angular displacement, respectively, of the device with respect to inertial space, thereby constituting an NMR gyroscope.

More particularly, a steady magnetic field is applied to an NMR cell which is substantially shielded from other steady magnetic fields. The NMR cell contains a gas or vapor of a substance that possesses a magnetic moment that can be aligned by optical pumping together with one or more additional gases, each of which possesses a nuclear magnetic moment. The NMR cell is illuminated by optical pumping light which has a directional component that is parallel to the direction of the steady magnetic field and which has the proper wavelength to be absorbed by the optically pumpable substance and partially align the magnetic moments of that substance. The nuclear moments of the nuclear moment gases are caused to become aligned and are caused to precess at their respective Larmor precession frequencies about the direction of the steady magnetic field. An AC magnetic field at a suitable carrier frequency is also applied to the NMR cell and the cell is illuminated by detection light which has a directional component that is orthogonal to the direction of the AC carrier magnetic field and which has a wavelength that is essentially the same as that of the optical pumping light. The intensity of that part of the detection light that is transmitted by the cell is modulated in accordance with the totality of the magnetic fields present in the cell, including the magnetic fields that are generated by the precessing nuclear magnetic moments. These modulations of the transmitted light intensity are detected by a photodetector, after which they are electronically demodulated to obtain signals at the Larmor precession frequencies of the nuclear moment gases.

In one embodiment, the alignment of the nuclear magnetic moments of each nuclear moment gas is accomplished by collisional interactions between the atoms of the optically pumpable substance and the atoms of the nuclear moment gas or gases. Sustained precession of the nuclear magnetic moments of each nuclear moment gas is accomplished by the application of an AC feedback magnetic field at the Larmor precession frequency of the nuclear moment gas in a direction that is orthogonal to the direction of the steady magnetic field. The AC carrier magnetic field is applied at substantially the Larmor precession frequency of the optically pumpable substance and in a direction that is substantially parallel to the direction of the steady magnetic field, thereby permitting the device to be operated at higher values of the steady magnetic field strength and with correspondingly higher Larmor precession frequencies for the nuclear moment gases.

In the preferred embodiment, an optically pumpable substance such as an alkali metal vapor is placed in an NMR cell together with two noble gases and the nuclear magnetic moments of both noble gases are aligned simultaneously by collisional interactions between the atoms of the alkali metal atoms and the atoms of the two noble gases. In this preferred embodiment of the invention, the alkali metal is rubidium and the noble gases are krypton-83 and xenon-129.

Another feature of the invention involves the use of at least one buffer gas in substantial quantities in the NMR cell.

In accordance with still another feature of the invention, the magnitude of the steady magnetic field is caused to remain constant by feedback control of the field in such a way that the difference between the Larmor precession frequencies of the two noble gases in the NMR cell is caused to be equal to a predetermined constant value.

In accordance with yet another feature of the invention, one of the Larmor precession frequencies is compared to a precision reference frequency and the resulting difference frequency is utilized to provide a measurement of angular displacement or angular rate of the device about the direction of the steady magnetic field.

These and other features of the invention will be made clear with reference to the sections entitled "Principles of the Invention" and "Detailed Description of the Preferred Embodiment."

It is the object of this invention to provide an NMR gyroscope utilizing nuclear moment gases that have long relaxation times.

It is another object of this invention to provide a technique for obtaining nuclear magnetic moment alignment and nuclear magnetic resonance in these gases.

It is still another object of this invention to provide a technique for detecting the Larmor precession frequencies of these gases.

It is yet another object of this invention to provide a technique for detecting and controlling the internal magnetic field environment of the gyroscope.

PRINCIPLES OF THE INVENTION

An NMR gyroscope operates on the principle of sensing angular rotation rate as a shift in the Larmor precession frequency of one or more nuclear species that possess nuclear magnetic moments.

Many atomic isotopes (usually those with odd atomic mass number) possess an inherent angular momentum (spin) associated with the nucleus. Always coexisting with such nuclear angular momentum is a magnetic moment parallel with it. The ratio between the nuclear magnetic moment and the nuclear angular momentum is a constant, $\gamma$, called the gyromagnetic ratio, which has a particular value for each type of isotope.

If a nuclear magnetic moment is placed in a magnetic field, with any orientation other than being parallel to the direction of the field, then the magnetic moment will precess about the direction of the field with an angular frequency, $\omega_L$, called the Larmor precession frequency, which is equal to:

$$\omega_L = \gamma H \quad (1)$$

where $\gamma$ is the gyromagnetic ratio and H is the magnetic field strength. Each isotope, therefore, has a characteristic Larmor precession frequency in a given magnetic field.

If a system containing atoms that collectively have a precessing magnetic moment is itself rotating at an angular rate, $\omega_r$, about the direction of H, then the observed precession frequency will be shifted by an amount equal to that rotation rate so that the observed Larmor precession frequency will become:

$$\omega = \gamma H - \omega_r \quad (2)$$

Thus, a measurement of the observed Larmor frequency, $\omega$, can be used as a measure of this rotation rate if both $\gamma$ and H are known.

If the Larmor precession frequencies of two isotopes, each having a different value of $\gamma$, are measured in the same magnetic field, then the rotation rate can be measured without direct knowledge of the value of the magnetic field. The equations for the two isotopes are:

$$\omega_a = \gamma_a H - \omega_r \quad (3)$$

where $\omega_a$ and $\omega_b$ are the observed Larmor frequencies of the two isotopes having gyromagnetic ratios $\gamma_a$ and $\gamma_b$, respectively. Solving these equations for either H or $\omega_r$ gives the following expressions:

$$H = (\omega_a - \omega_b)/(\gamma_a - \gamma_b) \quad (4)$$

which is independent of the angular rotation rate, $\omega_r$, and $$\omega_r = (\gamma_b \omega_a - \gamma_a \omega_b)/(\gamma_a - \gamma_b) \quad (5)$$

which is independent of the magnetic field strength, H.

In one of the embodiments of this invention, the magnetic field strength is caused to be constant by controlling the field in such a way that the frequency difference, $\omega_a - \omega_b$, between the two observed Larmor precession frequencies is always equal to a constant. Specifically, two precision reference frequencies, $\omega_a'$ and $\omega_b'$, which are derived from a very stable, common frequency source, are chosen such that $\omega_a'$ is approximately equal to $\gamma_a H$, and $\omega_b'$ is approximately equal to $\gamma_b H$, and their ratio accurately satisfies the following relationship:

$$\omega_a'/\omega_b' = \gamma_a/\gamma_b \quad (6)$$

The magnetic field strength is then servo-controlled in such a way that the measured frequency difference between the two observed Larmor precession frequencies is always caused to be equal to the frequency difference between the two precision reference frequencies, namely:

$$\omega_a - \omega_b = \omega_a' - \omega_b' \quad (7)$$

As a consequence of imposing the two conditions defined by equations (6) and (7), it follows that the magnetic field strength is equal to:

$$H = (\omega_a' - \omega_b')/(\gamma_a - \gamma_b) = \omega_a'/\gamma_a = \omega_b'/\gamma_b \quad (8)$$

which is a constant, and that the angular rotation rate is equal to:

$$\omega_r = \omega_a' - \omega_a = \omega_b' - \omega_b \quad (9)$$

and can therefore be readily obtained by measuring the difference between either one or the other of the observed Larmor precession frequencies and its associated precision reference frequency.

In addition to the basic phenomenon of magnetic moment precession and the mathematical basis for the signal processing mechanization which permits angular rotation rate information to be measured, as described above, there are several other physical phenomena involved in the implementation of a practical nuclear magnetic resonance gyroscope. Those that will be described are the alignment of nuclear magnetic moments, the achievment of sustained precession of these moments, and the optical detection of the precessing moments to provide a signal from which the Larmor precession frequency can be determined.

The magnitude of an individual nuclear magnetic moment is extremely small and the natural equilibrium condition is one in which a nearly random orientation of moments exists in an ensemble of atoms. Techniques must be used to orient a significant fraction of these magnetic moments in a single direction so that a macroscopic magnetic moment, and consequently a measureable signal, will be produced.

The technique that is used for aligning nuclear magnetic moments, as embodied in this invention, is a two-stage process and will be referred to as "pumping." The two nuclear magnetic moment gases, which are noble gases in the preferred embodiment of this invention, are combined with an alkali metal vapor in a single, optically transparent cell. This cell is illuminated by a spectrally filtered, circularly polarized, beam of light which is emitted by an alkali metal vapor electric discharge lamp. A steady magnetic field is applied in such a direction that a significant component of this field is parallel to the direction of the light that is incident on the cell.

The first stage of pumping is an optical pumping process in which the alkali metal vapor atoms are optically pumped by absorption of some of the incident light. This results in the alignment of a significant fraction of the atomic magnetic moments of the alkali atoms in a direction that is parallel to that of the applied steady magnetic field.

The second stage of pumping is a spin exchange pumping process in which some of the alignment of the atomic magnetic moments of the alkali atoms is transferred to the nuclear magnetic moments of the noble gas atoms by spin exchange interactions during collisions between the alkali atoms and noble gas atoms. This results in the alignment of a significant fraction of the nuclear magnetic moments of the noble gas atoms in a direction that is parallel to that of the steady magnetic field. This spin exchange pumping technique is an extension of the techniques of Bouchiat, Carver, and Varnum (Phys. Review Letters 5, page 373, [1960]). In particular, as embodied in this invention, it has been extended to include the simultaneous alignment of the nuclear magnetic moments of two different noble gas isotopes contained in the same cell.

The aligned magnetic moments of the alkali system and of both noble gas systems of atoms are subject to relaxation mechanisms which cause their alignments to decay exponentially with time towards their natural equilibrium condition of random orientation. Each system of moments is characterized by a relaxation time constant which depends upon the kinds and quantities of all other constituents and upon the total environment in the NMR cell. The steady state fractional alignment of each system of moments is a function of both the pumping rate and the relaxation time for that system, with larger fractional alignments, hence larger signal amplitudes, being achieved when the relaxation times are also long. Accordingly, in order to achieve the longest possible relaxation times, a suitable amount of a buffer gas such as helium or nitrogen is also contained in the cell in order to reduce the relaxation effects due to interactions of the magnetic moments with the walls of the cell. Furthermore, particular isotopes of particular noble gases have been chosen as the nuclear magnetic moment gases specifically because of their long relaxation times.

Precession of the two systems of noble gas magnetic moments is started and sustained by applying two AC magnetic fields in a direction which is orthogonal to that of the applied steady magnetic field. These fields have frequencies that are equal to the respective Larmor precession frequencies of the two noble gases and are referred to as the AC feedback magnetic fields inasmuch as they provide the feedback signal function that is necessary in any oscillator in order to achieve sustained oscillations. These feedback fields cause each individual system of noble gas magnetic moments to be torqued coherently away from the direction of their initial alignment, which is parallel to that of the steady magnetic field, into a plane which is orthogonal to the direction of the steady magnetic field. The magnetic moments of each system precess continuously in this plane, thereby creating two macroscopic magnetic moments throughout the volume of the NMR cell, hence two magnetic fields, which rotate in this plane at the respective Larmor precession frequency of the two noble gases. The physics associated with the torquing of spinning bodies requires that the phases of the applied feedback fields be in quadrature with the respective phases of the precessing nuclear magnetic moments.

These precessing nuclear magnetic moments are optically detected using an approach which is adapted from a magnetometer technique that was first developed in France by C. Cohen Tannoudji, J. Dupont-Roc, S. Haroche, and F. Laloë (Rev. de Phys. Appl. 5, 95 [1970]). This magnetometer technique works on the principle that the degree of absorption of optical pumping light by the alkali atoms in the NMR cell depends upon the directional orientation of the magnetic moments of the individual alkali atoms with respect to the direction of the incident light. Both of the two rotating magnetic fields, which are created by the two systems of precessing noble gas nuclear magnetic moments, individually and simultaneously exert torques on the precessing alkali magnetic moments, thereby imparting nutational motions to the precessing alkali moments which, in turn, modulate the intensity of the transmitted light. The mathematical description and the salient characteristics of this optical detection process can be summarized very briefly as follows:

As embodied in this invention, a sinusoidal AC magnetic field, $H_1 \cos \omega_c t$, which will be referred to as the carrier magnetic field, is applied to the cell and the direction of this carrier magnetic field is used to define the z-axis. A steady magnetic field is also applied to the cell essentially in the direction of the z-axis. The components of all magnetic fields, excluding the carrier magnetic field, are denoted as $H_x$, $H_y$, and $H_z$. The optical pumping light is incident on the cell in the x-z plane and has components $I_x$ and $I_z$, which produce alkali magnetization components $M_x$ and $M_z$.

It can be shown that under the following magnetic field conditions:

$$|H_x| < 1/\gamma\tau, \quad |H_y| \lesssim 1/\gamma\tau, \text{ and}$$

$$|H_z - (n\omega_c/\gamma)| < 1/\gamma\tau \qquad (10)$$

where $\gamma$ is the gyromagnetic ratio for the alkali atom, $\tau$ is the total alkali relaxation time under the influence of the light absorption and relaxation process, $\omega_c$ is the frequency of the carrier magnetic field, and n is an integer, that the x-component of the transmitted light intensity, $I_{tx}$, is described (excluding a constant term) by the relation:

$$I_{tx} = \frac{kI_x}{1 + (J_n\gamma H_y\tau)^2} \sum_{p=0}^{\infty} \{[J_+][M_x - M_z(\gamma H_y\tau)]\cos p\omega_c t + [J_-][M_z(\gamma H_x\tau)]\sin p\omega_c t\} \qquad (11)$$

where k is a constant and $J_\pm$ is defined as:

$$J_\pm = J_{n+p}(\gamma H_1/\omega_c) \pm J_{n-p}(\gamma H_1/\omega_c) \qquad (12)$$

and where $J_n$ and $J_{n\pm p}$ are Bessel functions of order n and $n\pm p$, respectively, with the same argument $\gamma H_1/\omega_c$, and $H_1$ and $\omega_c$ are the amplitude and frequency, respectively, of the carrier magnetic field.

We note several aspects of equation (11) which are relevant to this invention:

(a) The x-component of the transmitted light intensity, $I_{tx}$, consists of a sum of harmonics of the carrier frequency, $\omega_c$.

(b) The in-phase ($\cos p\omega_c t$) response is linear in the field $H_y$ for small values of $H_y$.

(c) The quadrature-phase ($\sin p\omega_c t$) response is linear in the field $H_x$ for small values of $H_x$.

(d) The x-component of the transmitted light intensity can be made to be linear in either $H_x$ alone or in $H_y$ alone by choosing a particular amplitude for the carrier magnetic field, $H_1$, such that either $J_{30}$ or $J_-$, respectively, equals zero. For n=1, it is most convenient to set $H_1$ such that $J_2(\gamma H_1/\omega_c) = J_0(\gamma H_1/\omega_c)$, whereby the p=1 term of J equals zero. The $\cos \omega_c t$ term of equation (11) can then be used to produce usable $H_y$ information, and the $\sin 2\omega_c t$ term can be used to develop usable $H_x$ information.

(e) The response of the x-component of the transmitted light intensity to either the $H_x$ or the $H_y$ magnetic field components is proportional to the product of the x-component of the incident light and the z-component of the magnetization, $I_x M_z$. The incident light beam must therefore have components in both the x-direction and the z-direction.

(f) Due to the conditions imposed on the magnetic fields, as defined by equation (10) for the case $n \neq 0$, the steady magnetic field must be applied essentially in the z-direction and the precession of the nuclear moments must occur essentially in the x-y plane. In particular, these precessing moments create a macroscopic magnetic field that rotates at the Larmor precession frequency and which has an amplitude that is proportional to the fractional alignment of the nuclear magnetic moments. This rotating magnetic field is responsible for a term in the x-component of the transmitted light intensity that is due to the y-axis component of this field, namely:

$$I_{tx} \sim h_a (\cos \omega_a t)(\cos p\omega_c t) \qquad (15)$$

where $h_a$ is the amplitude of this rotating magnetic field and $\omega_a$ is the Larmor precession frequency of the nuclear moment gas. It is this term which is utilized for extracting the nuclear Larmor precession frequencies in the embodiment of this invention. The preceding analysis is valid for steady magnetic fields and also for slowly varying fields, including the above rotating magnetic field, in particular, provided that the condition $\omega_a \tau < 1$ is satisfied.

(g) The effects of steady magnetic field components of $H_x$ and $H_y$ can be separately determined from the light intensity modulations and this makes it possible to independently measure or control these field components.

DESCRIPTION OF THE DRAWINGS

FIG. 2A is a perspective drawing illustrating a portion of the magnetic coils for generating the z axis field.

FIG. 2B is a perspective drawing illustrating the portion of the magnetic field coils for generating the x axis and y axis fields.

FIG. 3 is a conceptual diagram illustrating the processes of optical pumping and of modulation of the intensity of the light that is transmitted by the NMR cell.

FIG. 5 is a conceptual diagram showing an alternative configuration of an NMR gyro sensor assembly. FIG. 5 also serves to illustrate the configuration of a research apparatus.

DETAILED DESCRIPTION OF THE PREFERRED EMBODIMENT

Figure 1:
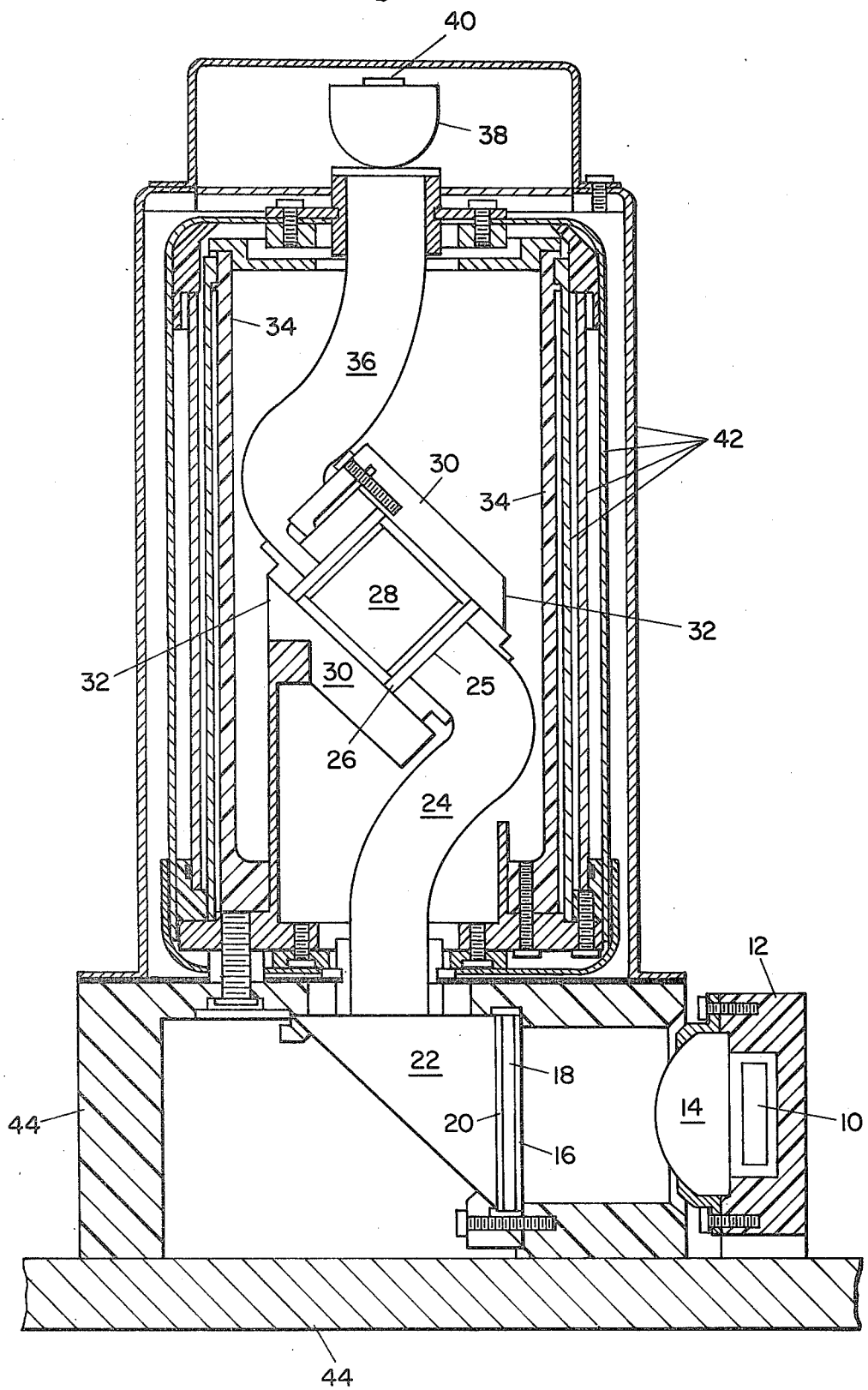
FIG. 1 is a sectional drawing showing the physical arrangement of components of an NMR gyro sensor assembly.

With reference to FIG. 1, which is a sectional drawing showing the physical arrangement of components of an NMR gyro assembly, a rubidium vapor lamp 10, which is excited by a high frequency power source, is used to emit light contaning the spectral lines of rubidium. This lamp is similar in design to that described by Bell, Bloom and Lynch (Rev. Sci. Instr. 32, 688 [1961]). The lamp 10 is housed in an enclosure 12 which is used to maintain the lamp at an elevated temperature suitable for maximum light emission. The light passes through a glass condenser lens 14 and through a plastic fresnel collimating lens 16 before passing through an optical interference filter 18. This filter is designed to transmit most of the 794.7 nanometer wavelength light from one spectral line of the rubidium while blocking most of the 780.0 nanometer wavelength light from an adjacent spectral line. The filtered light passes through a second fresnel collimating lens 20, is reflected in a prism 22 to change its direction and converges on the end of an input fiber optics bundle 24. This fiber optics bundle then transmits the light towards the center of the device and makes a bend so that the light leaves the end 25 of the bundle 24 with a mean angle of about 45 degrees relative to the vertical as shown in the drawing. The vertical axis as shown in the drawing is designated as the z-axis. The x-axis is defined to be pointing to the left in the drawing. Thus, FIG. 1 is a sectional drawing in the x-z plane. The light leaving the bundle passes through a circular polarizer 26, and enters the NMR cell 28.

The NMR cell 28 is a sealed, optically transparent, glass cylindrical enclosure containing a small quantity of isotopically enriched rubidium-87 metal, approximately 0.5 torr of isotopically enriched xenon-129 gas, approximately 20 torr of isotopically enriched krypton-83 gas, and a buffer gas consisting of either about 400 torr of helium-4 or about 100 torr of nitrogen. These are introduced into the cell in the order stated while the cell is attached to a vacuum filling station and the cell is then sealed off.

The cell 28 is mounted in a temperature controlled alumina oven 30 which is heated and controlled by a resistance band heater 32 that uses a high frequency power source. The oven is maintained at a temperature of about 65° C., at which temperature approximately one-half of the light entering the cell 28 is absorbed. Most of the light that is not absorbed in the cell 28 enters an output fiber optics bundle 36 and passes through a lens 38 to a silicon photodetector 40. Other components shown in this drawing are a magnetic field coil structure 34, which will be described in more detail below, (FIG. 2) a set of several layers of magnetic shielding 42 designed to attenuate the influence of external magnetic fields, and a supporting structure 44.

The magnetic field coil structure 34 consists of a machinable glass (Corning "MACOR") cylindrical coil form, on the outer surface of which grooves have been cut and then wires laid in the grooves to form the magnetic field coils.

FIGS. 2A and 2B are a perspective drawing illustrating the configuration of the magnetic field coils that are a part of FIG. 1 (See U.S. Pat. No. 4,063,207) FIG. 2A shows the coil form 34' and the main solenoidal coil windings 50 that produce a magnetic field that is parallel to the axis of the cylinder, which is designated as the z-axis. Additional coil windings 52 at the ends of the coil form are employed to improve the spatial uniformity of the magnetic field. The coil windings 52 are commingled with the coil windings 50. The combination of 50 and 52 will be referred to as the z-axis field coils.

FIG. 2B shows the same coil form 34' and two additional coil pairs that provide magnetic fields along two axes that are mutually orthogonal to each other and to the axis of the cylinder. Coil pair 54 provides a magnetic field along the x-axis and coil pair 56, only one member of which is visible in the drawing, provides a magnetic field along the y-axis.

FIG. 3 is a conceptual diagram illustrating for each of the noble gases the processes of optical pumping and of modulation of the intensity of the light that is transmitted through the NMR cell. Because these processes are so similar for the two noble gases, they are illustrated and described for only one of the two noble gases. In particular, they apply for the case n=1, where n is as used in equations (11) and (12). The circularly polarized light which enters the NMR cell 28' has a component 64 along the z-axis, which is referred to as optical pumping light, and a component 66 along the x-axis, which is referred to as detection light. Through the interactions of the optical pumping light 64 and the steady magnetic field 68, the rubidium atoms 60 have their magnetic moments aligned preferentially in the z-direction. By interatomic collisions, this magnetic moment alignment is transferred from the rubidium atoms 60 to the noble gas nuclei 62.

A sinusoidal AC feedback magnetic field 70 that is matched in frequency and phase to the Larmor precession frequency of the collective magnetic moment of the noble gas nuclei 62 is applied in the x-direction and serves to torque the magnetic moment of these nuclei to the x-y plane. This component of noble gas nuclear magnetic moment then precesses in the x-y plane at the noble gas Larmor precession frequency, $\omega_a$, about the steady magnetic field 68. This precessing nuclear magnetic moment component create a nuclear precession magnetic field of strength, $h_a$, that rotates in the x-y plane and which therefore has a component in the y-direction that is equal to ($h_a \cos \omega_a t$).

The detection light 66 interacts with the rubidium atoms 60, which are under the influence of the steady magnetic field 68, a superimposed AC carrier magnetic field 69, and the y-component of the nuclear precession field, $h_a$. This interaction causes the intensity of the x-component of the transmitted light 72 to be modulated at the carrier frequency, $\omega_c$, with a modulation envelope 74 at the nuclear precession frequency, $\omega_a$. These light modulations are then converted into electrical signals by the silicon photodetector 40'.

Figure 4:
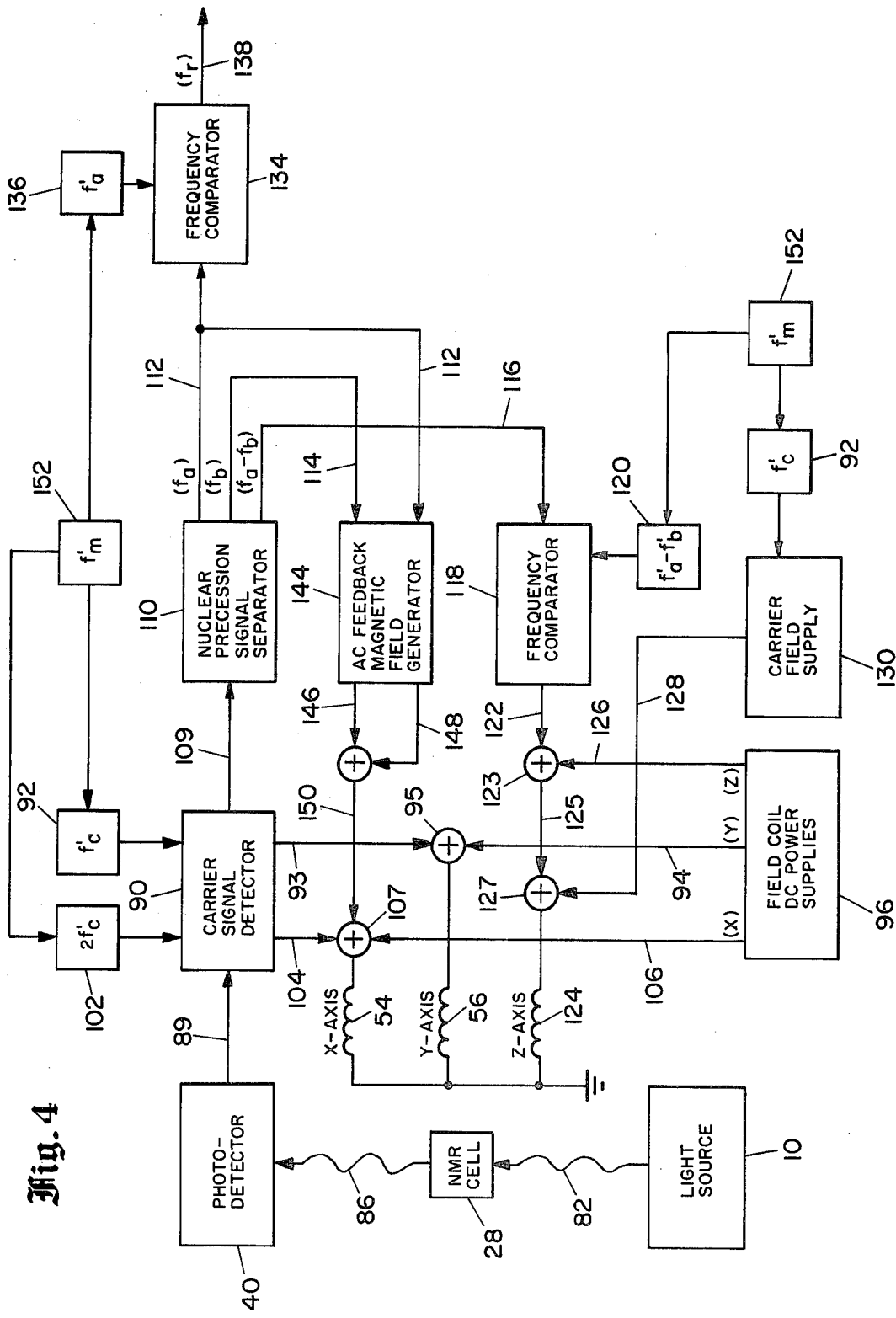
FIG. 4 is a block diagram indicating the functional mechanization of the electronics of an NMR gyro.

With reference to FIG. 4, which is a block diagram indicating the functional mechanization of the electronics of an NMR gyro, light from the light source 10 enters the device through the input optics 82 and passes through the NMR cell 28. Input optics 82 comprises items 14 through 26 as discussed above. The light that is not absorbed and which is modulated in intensity, as described above (FIG. 3), is transmitted by means of the output optics 86 to the photodetector 40 where the light intensity modulations are converted into an electrical signal 89. Output optics 86 comprises items 36 and 38 as discussed above. The signal 89 is first amplified and then synchronously demodulated in two separate conditions in a carrier signal detector 90 in order to generate control signals for the x-axis and y-axis magnetic fields.

A DC signal 93 for controlling the y-axis DC magnetic field is generated by synchronously demodulating the signal 89 using a sinusoidal reference signal having a frequency, $f_c'$, that is derived from a crystal controlled precision reference frequency source 92. The frequency and phase of the sinusoidal signal from source 92 are the same as those of the applied AC carrier magnetic field. The amplitude of the DC control signal 93 is proportional to the amplitude of that component of the light intensity modulations at the carrier frequency that is in phase with the applied AC carrier magnetic field. By reference to equation (11), this DC signal 93 is also proportional to the value of the y-axis magnetic field. The DC control signal 93 is summed at point 95 with an additional constant DC signals 94 that is generated in the DC power supplies 96 and the used to is used supply the total DC current to the y-axis magnetic field coil 56. The y-axis DC magnetic field is thereby controlled in such a way that the amplitude of the DC signal 93 remains close to zero, which results in a suppressed carrier mode of operation. In this manner, changes in the y-axis magnetic field are sensed and corrected to maintain carrier suppression.

In a similar manner, a DC signal 104 for controlling the DC component of the x-axis magnetic field is generated by synchronously demodulating the signal 89 usng a sinusoidal reference signal having a frequency, $2f_c'$, that is derived from a crystal controlled precision reference frequency source 102. By setting $J_o(\gamma H_1/\omega_c)=J_2(\gamma H_1/\omega_c)$, for $n=p=1$, the coefficient of the sin $\omega_c t$ term becomes zero, and a higher harmonic is then used. The reference signal at $2f_c'$ generated by source 102 is timed relative to the reference signal $f_c'$ such that when the $f_c'$ signal is represented as cos $\omega_c' t$, the $2f_c'$ signal is represented as sin $2 \omega_c' t$. The amplitude of the DC control signal 104 is proportional to the value of the x-axis magnetic field. The DC control signal 104 is summed at point 107 with an additional constant DC signal 106 that is generated in the DC power supplies 96 and the resultant is used to supply the total DC current to the x-axis magnetic field coil 54. In this manner, the value of the DC component of the x-axis magnetic field is controlled to be essentially equal to zero.

In addition to the DC signal 93 resulting from the synchronous demodulation at the frequency, $f_c'$ in the carrier signal detector 90 there are AC signals 109 which are proportional to the AC components of the y-axis magnetic field. Of particular interest, are the modulations at the nuclear Larmor precission frequencies. These signals are separated and filtered in a nuclear precession signal separator 110 to yield a signal 112 at the xenon-129 precession frequency, $f_a$, of about 135 hertz, a signal 114 at the krypton-83 precession frequency, $f_b$, of about 19 hertz, and a signal 116 at their difference frequency, $f_a-f_b$, of about 116 hertz. These stated values for the nuclear Larmor precession frequencies are for a z-axis steady magnetic field value of 0.114 gauss which is used in the preferred embodiment.

A DC signal 122 for controlling the DC component of the z-axis magnetic field is generated by comparing the precession difference frequency, $f_a-f_b$, 116 in a frequency comparator 118 to a reference frequency, $f_a'-f_b'$, that is generated by the crystal controlled precision reference frequency source 120. Any phase difference between the signals 116 and 120 creates a DC control signal 122 which is summed at point 123 with an additional constant DC signal 126 that is generated in the DC power supplies 96 and the resultant signal 125 is used to supply the total DC current to the z-axis magnetic field coil 124 which comprises coils 50 and 52. In this manner, the value of the DC component of the z-axis magnetic field is controlled to be equal to a specific constant value as given by equation (8).

A sinusoidal AC current 128, that is generated by the carrier field supply 130, is also applied to the z-axis magnetic field coil 124 to produce an AC carrier magnetic field. The AC carrier current 128 is summed at point 127 with the DC currents 125 and the resultant comprises the total current supplied to the z-axis magnetic field coil 124. The sinusoidal AC carrier current 128 has a frequency, $f_c'$, that is generated by the crystal controlled precision reference frequency source 92, which is the same as the signal used as a reference signal for the carrier signal detector 90. The carrier frequency, $f_c'$, is about 80,000 hertz, which is equal to the Larmor precession frequency of rubidium-87 for a z-axis steady magnetic field value of 0.114 gauss which is used in the preferred embodiment.

The amplitude of the AC carrier current 128 is selected to have a specific value such that the amplitude of the sinusoidal AC carrier magnetic field is equal to a particular factor times the DC component of the z-axis magnetic field which is produced by the DC current 125. In the preferred embodiment, this factor has a value of 1.84 and the amplitude of the AC carrier magnetic field is made equal to 0.210 gauss. In this manner, the amplitude of the component of the signal 89 at the carrier frequency, $f_c'$, is made to be insensitive to x-axis magnetic fields. The mathematical basis for this preferred relationship between the two fields is contained in equations (11) and (12) for the case $n-1$ and $p=1$.

Two feedback magnetic fields are created along the x-axis in order to achieve sustained precession of the nuclear magnetic moments of xenon-129 and kyrpton-83. The xenon-129 signal 112 is used in an AC feedback magnetic field generator 144 to generate a sinusoidal AC feedback signal 148 which has a constant amplitude and a frequency and phase that are identical with those of the xenon-129 signal 112. The signal 148 is summed with a similarly generated sinusoidal AC feedback signal 146 that is derived from the krypton-83 signal 114. The sum 150 of the two AC feedback currents 146 and 148 is further summed at point 107 with the DC currents 104 and 106 and the resultant comprises the total current that is supplied to the x-axis magnetic field coil 54. The function of the AC feedback magnetic fields is to continuously torque the xenon and krypton nuclear magnetic moments, that have been newly aligned along the z-axis, into the x-y precession plane to replenish those moments that have been lost through nuclear magnetic moment relaxation processes. In this manner, the sustained precession of xenon and krypton magnetic moments creates two steady state magnetic fields that rotate in the x-y plane and which consequently produce steady state light intensity modulations at the Larmor precession frequencies, $f_a$ and $f_b$.

The angular rotation rate of the gyro is obtained by comparing the Larmor precession frequency, $f_a$, of the xenon-129 signal 112 in a frequency comparator 134 with a reference frequency $f_a'$, that is derived from a crystal controlled precision reference frequency source 136. The resultant difference frequency $f_a'-f_a$, is equal to the angular rotation frequency, $f_r$, of the gyro, in accordance with equation (9), and this data 138 is sent to a computer for further processing. The gyro angular rotation rate data 138 contains both frequency information and phase information and therefore contains both angular rate information and angular displacement information, respectively.

All precision reference frequency sources 92, 102, 120 and 136 are driven by a common crystal controlled master oscillator 152 by digital multiplication and division techniques. The frequency of the master oscillator 152 is denoted as $f_m'$ in FIG. 4. The angular rotation rate data 138 is, to first order, independent of the frequency stability of the master oscillator 152.

With reference to FIG. 5, which is a conceptual diagram showing an alternative embodiment of an NMR gyro sensor assembly, items identified with primed numerals are functionally similar to the corresponding unprimed items. Rubidium lamp 10' supplies optical pumping light through the input light pipe 24' to the NMR cell 28'. The lamp 10' also supplies detection light to the NMR cell 28' through a second channel which includes input light pipe 154 and input prism 155. The detection light that is transmitted by the NMR cell 28' passes through the output prism 158 and output light pipes 156 and 160 to the photodetector 40'. Suitable magnetic fields are applied to the NMR cell through the three-axis Helmoltz coil assembly 161, 162 and 163, which in this arrangement are the field coils for the z-axis, y-axis, and x-axis, respectively. The direction of the input light through the light pipe 24' is here defined to be along the z-axis, the x-axis is up in the drawing, and the y-axis is out of the paper.

The arrangement shown in FIG. 5 is an alternative to that of FIG. 1 which serves to emphasize that optical detection should be accomplished in a direction that is transverse to that of the steady magnetic field which is along the z-axis. This may be accomplished either as shown in FIG. 1 using a 45 degree or other similar angle between the direction of the light beam through the NMR cell relative to the direction of the steady magnetic field, or as shown in FIG. 5 using two separate light paths with the pumping light being parallel with the direction of the steady magnetic field and the detection light being transverse to the direction of the field. This arrangement also includes the possibility that the pumping and detection light beams could originate from separate light sources and that they could also have different spectral or polarization characteristics.

With certain modifications, FIG. 5 can also be used to illustrate the configuration of a research apparatus that is especially useful for performing experimental investigations of the properties of noble gas-alkali vapor systems. The modifications consist of deleting the detection light path 154, 155, 156. 158, 160 and 40', and adding the output light path 174 and 175. For this application, which corresponds to the case of n=0 as used in equations (11) and (12), the coordinate axes are relabeled, with the x-axis and z-axis being interchanged from before, so that the direction of the input light through the light pipe 24' is redefined as being along the x-axis and the z-axis is up in the drawing. The input light passes through the cell 28' and into an output light pipe 174 which transmits the light to the photodetector 175. The AC carrier magnetic field is applied using the z-axis field coil 163 and a small DC field of approximately 100 microgauss is applied using the y-axis field coil 162. During operation, a larger DC field of approximately 10 milligauss is applied by the x-axis field coil 161 during the initial nuclear magnetic moment spin exchange pumping time. At the conclusion of the pumping time, which is typically a few minutes, this field is quickly turned off leaving the aligned nuclear magnetic moments to precess in the x-z plane, which is in the plane of the paper. The z-axis component of the precessing nuclear magnetic field produces light intensity modulations analogous to the ones described above. This mode of operation is quite similar to that described by Cohen-Tannoudji, et al. (ibid) except that in this alternative embodiment the rubidium magnetic moments that are used for detection and the noble gas nuclear magnetic moments that are used for nuclear Larmor precession are located in the same cell 29'. The close association of the rubidium atoms during collisions with the noble gas atoms causes the rubidium atoms to sense a much larger average magnetic field from the noble gas nuclei. This proximity effect results in signals that are much larger than might otherwise be detectable. This apparatus is therefore especially useful for research studies on the properties of the noble gas-alkali vapor system.

RELATED PATENTS

A number of patents which relate to the fields of this invention are set forth below. A review of these references indicates that none of them discloses the novel features set forth in the claims of the present specification. However, it is considered appropriate for the benefit of the Patent Office to include all prior art that was discovered during the searches and these references are therefore listed below:

| Patent No. | Inventor | Title | Issued |
| --- | --- | --- | --- |
| 3,103,623 | I. A. Greenwood, Jr. | Nuclear Gyroscope | 9-10-63 |
| 3,103,624 | I. A. Greenwood, Jr., et al. | Nuclear Gyroscope | 9-10-63 |
| 3,396,329 | A. Salvi | Magnetic Resonance Magnetometers for Measuring Weak Magnetic Fields From Aboard a Moving Vehicle as a Plane | 8-6-68 |
| 3,404,332 | A. Abragam, et al. | Magnetic Resonance Devices for Accurately Measuring Magnetic Fields in Particular Low Magnetic Fields, on Board of a Movable Body | 10-1-68 |
| 3,500,176 | A. Kastler, et al. | Method and Apparatus for Controlling a Magnetic Field Employing Optically Pumped Nuclear Resonance | 3-10-70 |
| 3,513,381 | W. Happer, Jr. | Off-Resonant Light as a | 5-19-70 |

-continued

| Patent No. | Inventor | Title | Issued |
|---|---|---|---|
| 3,729,674 | J. R. Lowdenslager | Probe of Optically Pumped Alkali Vapors Digital Nuclear Gyroscopic Instrumentation and Digital Phase Locked Loop Therefore | 4-24-73 |

In conclusion, the present invention has been described in terms of particular elements and particular physical arrangements, but it is clear that reasonable alternatives, such as the use of different optical paths accomplishing the same results, or the use of different combinations of the noble gases or the use of a different substance than rubidium, or the use of other values for the frequencies or magnetic fields mentioned in the foregoing specification, may all be within the scope of the present invention.

We claim:

1. A nuclear magnetic resonance detection device comprising:
   a nuclear magnetic resonance cell;
   a gas vapor of an optically pumpable substance that possesses a magnetic moment and is capable of being optically pumped, said optically pumpable substance being contained in said cell;
   at least one nuclear moment gas each having a nuclear magnetic moment also contained in said cell, the nuclear magnetic moments of each said nuclear moment gas being at least partially aligned;
   means for applying a steady magnetic field to said cell;
   first means for illuminating said cell with optical pumping light capable of partially aligning the magnetic moments of said optically pumpable substance in one direction by absorption of said light;
   means for precessing said aligned nuclear magnetic moments of each said nuclear moment gas about the direction of the steady magnetic field at the respective Larmor precession frequencies of each said gas;
   means for applying an AC carrier magnetic field to the cell;
   second means of illuminating said cell with detection light of a wavelength approximately equal to a wavelength which can be absorbed by the optically pumpable substance;
   means for applying said detection light with a directional component orthogonal to the direction of said AC carrier magnetic field to produce modulations in the intensity of the transmitted part of said detection light substantially at the frequency of at least one harmonic, including the fundamental of said AC carrier magnetic field thereof;
   means for detecting at least one of said modulations in the intensity of the transmitted part of said detection light; and
   means for electrically demodulating said detected light intensity modulations to obtain a signal varying at the Larmor precession frequency of each said nuclear moment gas and with amplitude proportional to the degree of alignment of said nuclear magnetic moments of each said gas.

2. The device as claimed in claim 1 wherein said optically pumpable substance is an alkali metal.

3. The device as claimed in claim 1 wherein each said nuclear moment gas is a noble gas.

4. The device as claimed in claim 1 wherein said steady magnetic field has a component parallel to the direction of said optical pumping light.

5. The device as claimed in claim 4 wherein said nuclear magnetic moments of each nuclear moment gas are partially aligned by collisions of atoms of each said nuclear moment gas with atoms of said optically pumpable substance to partially transfer said alignment from said substance to each said gas.

6. The device as claimed in claim 1 wherein said light intensity modulations of said transmitted part of said detection light are produced by absorption of said detection light by the optically pumpable substance.

7. The device as claimed in claim 1 further including means for accurately measuring the magnitude and direction of said steady magnetic field.

8. A nuclear magnetic resonance device as defined in claim 1 further including means for accurately controlling the magnitude and direction of said steady state magnetic field.

9. A nuclear magnetic resonance oscillator comprising the device as claimed in claim 1 wherein said precessing means comprises means for applying an AC feedback magnetic field at said detected Larmor precession frequency of each said nuclear moment gas in a direction orthogonal to the direction of said steady magnetic field, further including means for detecting the phase of said Larmor precession frequency, and wherein each said detected phase of said Larmour precession frequency is utilized to control the respective phase of said AC feedback magnetic field substantially in quadrature with the phase of said processing nuclear magnetic moments of each said gas thereby causing a sustained precession of said moments of each said gas.

10. A nuclear magnetic resonance oscillator as claimed in claim 9 further including means for accurately measuring the magnitude and direction of said steady magnetic field.

11. A nuclear magnetic resonance oscillator as claimed in claim 9 further including means for accurately controlling the magnitude and direction of said steady magnetic field.

12. A nuclear magnetic resonance gyroscope comprising a nuclear magnetic resonance oscillator as claimed in claim 9 further including means for sensing angular displacements of said gyroscope about the direction of said steady magnetic field as changes in phase of the Larmor precession frequency of at least one of said nuclear moment gases.

13. A nuclear magnetic resonance detection device as defined in claim 1 wherein the steady magnetic field has a particular magnitude that causes the precession of the magnetic moments of said optically pumpable substance to occur substantially at a harmonic of the frequency of said applied AC carrier magnetic field, including the fundamental frequency, and wherein the direction of said steady magnetic field is substantially parallel to the direction of said applied AC carrier magnetic field.

14. A nuclear magnetic resonance detection device as claimed in claim 13 wherein said steady magnetic field applied to said nuclear magnetic resonance cell exceeds 0.01 gauss.

15. A nuclear magnetic resonance detection device as claimed in claim 13 wherein said detection light is of substantially the same wavelength as said optical pumping light.

16. A nuclear magnetic resonance detection device as claimed in claim 15 wherein said detection light and said optical pumping light originates from the same light source.

17. A nuclear magnetic resonance detection device as claimed in claim 16 wherein said detection light and said optical pump light are comprised of parallel components of a single beam of light from said light source.

18. A nuclear magnetic resonance detection device claimed in claim 16 wherein said detection light and said optical pumping light are comprised of nonparallel components of a single beam of light from said light source.

19. A nuclear magnetic resonance oscillator comprising the detection device as claimed in claim 13 wherein said means for causing the aligned nuclear magnetic moments of each said nuclear moment gas to precess about the direction of said steady magnetic field comprises means for applying an AC feedback magnetic field in a direction orthogonal to the direction of said steady magnetic field at the said detected Larmor precession frequency of each said nuclear moment gas, further including means for detecting the phase of each said Larmor precession frequency and wherein said detected phase of each said Larmor precession frequency is utilized to control the phase of the corresponding AC feedback magnetic field to be essentially in quadrature with the respective phase of said precessing nuclear magnetic moments of said gas thereby causing a sustained precession of said moments of said gas.

20. A nuclear magnetic resonance oscillator as defined in claim 19 further including means for electrically demodulating said detected light intensity modulations to obtain control signals having amplitudes proportional to magnetic field components transverse to said AC carrier magnetic field, and further including means for measuring or controlling said transverse field components.

21. A nuclear magnetic resonance gyroscope comprising the oscillator claimed in claim 19 further including means for sensing angular displacements or angular rates of the device about the direction of said steady magnetic field as changes in phase or as changes in frequency, respectively, of the Larmor precession frequencies of at least one said nuclear moment gas.

22. A nuclear magnetic moment alignment device comprising:
 a nuclear magnetic resonance cell;
 a gas or vapor of an optically pumpable substance that possesses a magnetic moment and is capable of being optically pumped, said optically pumpable substance being contained in said cell;
 first and second noble gases, chosen from the class consisting of xenon isotopes having a nuclear magnetic moment and krypton isotopes having a nuclear magnetic moment, and contained in said cell;
 means for applying a steady state magnetic field to said cell; and
 means for illuminating said cell with optical pumping light capable of partially aligning in one direction by absorption of said light the magnetic moments of said optically pumpable substance to cause the nuclear magnetic moments of said first and second noble gases to be partially aligned by collisions of atoms of said optically pumpable substance with atoms of said noble gases.

23. A nuclear magnetic moment alignment device as claimed in claim 22 wherein the said steady magnetic field has a component parallel to the direction of said optical pumping light.

24. A nuclear magnetic moment alignment device as claimed in claim 23, wherein a substantial amount of at least one buffer gas is also contained in said cell.

25. A nuclear magnetic moment alignment device as claimed in claim 24 wherein said buffer gas is helium.

26. A nuclear magnetic moment alignment device as claimed in claim 24 wherein said buffer gas is nitrogen.

27. A nuclear magnetic moment alignment device as claimed in claim 22 wherein said optically pumpable substance is an alkali metal.

28. A nuclear magnetic alignment device as claimed in claim 27 wherein said alkali metal is rubidium.

29. A nuclear magnetic moment alignment device comprising:
 a nuclear magnetic resonance cell;
 a gas or vapor of an optically pumpable substance that possesses a magnetic moment and is capable of being optically pumped, said optically pumpable substance being contained in said cell;
 xenon-129 and krypton-83 gases each having a nuclear magnetic moment and contained in said cell;
 means for applying a steady state magnetic field to said cell; and
 means for illuminating said cell with optical pumping light capable of partially aligning in one direction, by absorption of said light, the magnetic moments of said optically pumpable substance to cause the nuclear magnetic moments of said xenon-129 and krypton-83 gases to be partially aligned by collisions of atoms of said optically pumpable substance with atoms of said xenon129 and krypton-83.

30. A nuclear magnetic moment alignment device as claimed in claim 22 further including means for accurately measuring and controlling the magnitude and direction of steady magnetic field.

31. A nuclear magnetic resonance detection device comprising the alignment device as claimed in claim 20 further including means for precessing the aligned nuclear magnetic moments of said two noble gases about the direction of the steady magnetic field at the respective Larmor precession frequencies of said two noble gases and means for detecting said Larmor precession frequencies.

32. A nuclear magnetic resonance detection device as claimed in claim 31 further including means for utilizing the difference between the two Larmor precession freguencies of said two noble gases for accurately fixing the magnitude of the component of said steady magnetic field which is parallel to said AC carrier magnetic field to a predetermined level.

33. A nuclear magnetic resonance oscillator comprising the detection device as claimed in claim 31 wherein said means for causing the aligned nuclear moments of said two noble gases to precess about the direction of said steady magnetic field comprises means for applying in a direction orthogonal to the direction of said steady magnetic field two AC feedback magnetic fields at said respective detected Larmor precession frequencies of said two noble gases, further including means for detecting the phases of said Larmor precession frequencies, and wherein said detected phases of said Larmor precession frequencies are utilized to control the respective phases of said AC feedback magnetic fields to be essentially in guadrature with the respective phases of said precessing nuclear magnetic moments of said two noble gases thereby causing sustained precession of said moments of said two noble gases.

34. A nuclear magnetic resonance gyroscope comprising the oscillator as claimed in claim 33 further including means for sensing angular displacements or angular rates of the device about the direction of said steady magnetic field as changes in phase or as changes in frequency, respectively, of the Larmor precession frequencies of at least one of the said two noble gases.

35. A nuclear magnetic resonance detection device as claimed in claim 31 further including means for applying an AC carrier magnetic field to said nuclear magnetic resonance cell, and means for illuminating said cell with detection light of a wavelength approximately equal to a wavelength which can be absorbed by the optically pumpable substance, wherein said detection light has a directional component orthogonal to said AC carrier magnetic field, further including means for producing and detecting modulation in the intensity of said detection light at approximately the frequency of at least one harmonic of said AC carrier magnetic field and wherein said means for detecting said Larmor precession frequencies of said two noble gases comprises additional means for electrically demodulating at least one said detected light intensity modulation to obtain a signal varying at the Larmor precession frequencies of said noble gases and with amplitudes proportional to the degree of alignment of said nuclear magnetic moments of said gases.

36. A nuclear magnetic resonance detection device as claimed in claim 34 further including means for accurately measuring and controlling the magnitude and direction of said steady magnetic field.

37. A nuclear magnetic resonance detection device as claimed in claim 35 wherein the steady magnetic field has a particular magnitude that causes the precession of the magnetic moments of said optically pumpable substance to occur substantially at a harmonic of the frequency of said applied AC carrier magnetic field, including the fundamental, and wherein the direction of said steady magnetic field is substantially parallel to the direction of said applied AC carrier magnetic field.

38. A nuclear magnetic resonance detection device as defined in claim 37 further including means for accurately measuring or controlling the magnitude and direction of said steady magnetic field.

39. A nuclear magnetic resonance detection device as claimed in claim 38 wherein said means for controlling said steady magnetic field comprises means for electrically demodulating said detected light intensity modulations to obtain control signals having amplitudes proportional to magnetic field components transverse to said AC carrier magnetic field, and further including means for measuring and controlling said transverse field components and means for comparing the difference frequency between the two Larmor precession frequencies to a precision difference frequency reference to adjust to a predetermined level the magnitude of the component of said steady magnetic field which is parallel to the direction of said AC carrier magnetic field.

40. A nuclear magnetic resonance gyroscope comprising the detection device as claimed in claim 39 further including means for sensing angular displacements or angular rates of the device about the direction of said steady magnetic field as changes in phase or as changes in frequency, respectively, of the Larmor precession frequencies of at least one of the said two noble gases.

41. A nuclear magnetic resonance gyroscope as claimed in claim 39 further including means for comparing the change in said Larmor precession frequency of one of the noble gases to a precision Larmor frequency reference and means for deriving the frequency of said AC carrier magnetic field and the frequency of said precision difference frequency reference and the frequency of said precision Larmor frequency reference from a single precision frequency source.

42. A nuclear magnetic moment alignment device comprising:
  a nuclear magnetic resonance cell;
  a gas or vapor of an optically pumpable substance that possesses a magnetic moment and is capable of being optically pumped, said optically pumpable substance being contained in said cell;
  at least one nuclear moment gas having a nuclear magnetic moment and chosen from the class consisting of isotopes of xenon and krypton, and contained in said cell;
  a substantial amount of at least one buffer gas contained in said cell;
  means for applying a steady magnetic field to said cell; and
  means for illuminating said cell with optical pumping light capable of partially aligning in one direction, by absorption of said light, the magnetic moments of said optically pumpable substance to cause the nuclear magnetic moments of each said nuclear moment gas to be partially aligned by collisions of atoms of said optically pumpable substance with atoms of each said nuclear moment gas.

43. A nuclear magnetic moment alignment device comprising:
  a nuclear magnetic resonance cell;
  a gas or vapor of an optically pumpable substance that possesses a magnetic moment and is capable of being optically pumped, said optically pumpable substance being contained in said cell;
  at least xenon-129 having a nuclear magnetic moment and contained in said cell;
  a substantial amount of at least one buffer gas contained in said cell;
  means for applying a steady magnetic field to said cell; and
  means for illuminating said cell with optical pumping light capable of partially aligning in one direction, by absorption of said light, the magnetic moments of said optically pumpable substance to cause the nuclear magnetic moments of said xenon-129 to be partially aligned by collisions of atoms of said optically pumpable substance with atoms of said xenon-129.

44. A nuclear magnetic moment alignment device as claimed in claim 42 wherein said optically pumpable substance is an alkali metal.

45. A nuclear magnetic moment alignment device as claimed in claim 44 wherein said alkali metal is rubidium.

46. A nuclear magnetic moment alignment device as claimed in claim 42 wherein said buffer gas is helium.

47. A nuclear magnetic moment alignment device as claimed in claim 42 wherein said buffer gas is nitrogen.

48. A nuclear magnetic moment alignment device as defined in claim 42 wherein further means are provided for accurately measuring or controlling the magnitude and direction of said steady magnetic field.

49. A nuclear magnetic resonance detection device comprising an alignment device as claimed in claim 42 further including means for precessing the nuclear magnetic moments of each said nuclear moment gas about the direction of the steady magnetic field at the respective Larmor precession frequency of said gas and means for detecting said Larmor frequency.

50. A nuclear magnetic resonance oscillator comprising:
  a nuclear magnetic resonance cell;
  a gas or vapor of an optically pumpable substance that possesses a magnetic moment and is capable of being optically pumped, said optically pumpable substance being contained in said cell;
  a substantial amount of at least one buffer gas contained in said cell;
  means for applying a steady magnetic field to said cell;
  means for illuminating said cell with optical pumping light capable of partially aligning in one direction, by absorption of said light, the magnetic moments of said optically pumpable substance to cause the nuclear magnetic moments of each said nuclear moment gas to be partially aligned by collisions of atoms of said optically pumpable substance with atoms of each said nuclear moment gas;
  means for causing the aligned nuclear magnetic moments of each said nuclear moment gas to precess about the direction of said steady magnetic field at the respective Larmor precession frequency of said gas includes means for detecting said Larmor frequency and means for applying in a direction orthogonal to the direction of said steady magnetic field an AC feedback magnetic field at the said detected Larmor precession frequency of each said nuclear moment gas, and further including means for detecting the phase of said Larmor precession frequency to control the phase of said AC feedback magnetic field to be essentially in quadrature with the respective phase of said precessing nuclear magnetic moments of said gas to cause a sustained precession of said moments of each of said gases.

51. A nuclear magnetic resonance gyroscope comprising an oscillator as claimed in claim 50 further including means for sensing angular displacements or angular rates of the device about the direction of said steady magnetic field as changes in phase or as changes in frequency, respectively, of the Larmor precession frequencies of at least one of the said nuclear moment gases.

52. A nuclear magnetic resonance detection device comprising:
  a nuclear magnetic resonance cell;
  a gas or vapor of an optically pumpable substance comprising a substance that possesses a magnetic moment and is capable of being optically pumped, said optically pumpable substance being contained in said cell;
  at least one nuclear moment gas having a nuclear magnetic moment and contained in said cell;
  a substantial amount of at least one buffer gas contained in said cell;
  means for applying a steady magnetic field to said cell;
  means for illuminating said cell with optical pumping light capable of partially aligning in one direction, by absorption of said light, the magnetic moments of said optically pumpable substance to cause the nuclear magnetic moments of each said nuclear moment gas to be partially aligned by collisions of atoms of said optically pumpable substance with atoms of each said nuclear moment gas;
  means for precessing the nuclear magnetic moments of each said nuclear moment gas about the direction of the steady magnetic field at the respective Larmor precession frequency of said gas;
  means for detecting said Larmor frequency;
  means for applying an AC carrier magnetic field to said cell;
  means for illuminating said cell with detection light of a wavelength approximately equal to a wavelength which can be absorbed by the optically pumpable substance, wherein said detection light has a directional component orthogonal to said AC carrier magnetic field;
  means for producing and detecting modulations in the intensity of said detection light at or near the frequency of at least one harmonic of said AC carrier magnetic field frequency;
  said means for detecting said Larmor precession frequency of each said nuclear moment gas comprising additional means for electrically demodulating at least one of said detected light intensity modulations to obtain a signal varying at the Larmor precession frequency of each said nuclear moment gas and with amplitudes proportional to the degree of alignment of said nuclear magnetic moments of each said gas.

53. A nuclear magnetic resonance detection device comprising:
  a nuclear magnetic resonance cell;
  a gas or vapor of an optically pumpable substance comprising a substance that possesses a magnetic moment and is capable of being optically pumped, said optically pumpable substance being contained in said cell;
  at least one nuclear moment gas each having a nuclear magnetic moment also contained in said cell, the nuclear magnetic moments of each said nuclear moment gas being at least partially aligned;
  means for applying a steady magnetic field to said cell;
  first means for illuminating said cell with optical pumping light capable of partially aligning in one direction by absorption of said light, the magnetic moments of said optically pumpable substance;
  means for precessing said aligned nuclear magnetic moments of each said nuclear moment gas about the direction of the steady magnetic field at the respective Larmor precession frequencies of each said gas;
  means for applying an AC carrier magnetic field to the cell;
  second means for illuminating said cell with detection light of a wavelength equal to or approximately equal to a wavelength which can be absorbed by the optically pumpable substance;

said first and second means illuminating said cell with separate beams of light impinging from different directions;

means for applying said detection light with a directional component orthogonal to the direction of said AC carrier magnetic field to produce modulations in the intensity of at least one harmonic, including the fundamental of the transmitted part of said detection light substantially at frequency of said AC carrier magnetic field thereof;

means for detecting at least one of said m modulations in the intensity of the transmitted part of said detection light; and means for electrically demodulating said detected light intensity modulations to obtain a signal varying at the Larmor precession frequency of each said nuclear moment gas and with amplitude proportional to the degree of alignment of said nuclear magnetic moments of each said gas.

54. A nuclear magnetic resonance unit as claimed in claim 52 wherein said first means for illuminating said cell with optical pumping light illuminates said cell with light along a direction substantially parallel to said steady magnetic field and said second means for illuminating said cell with detection light illuminates said cell with light along the direction substantially orthogonal to said steady magnetic field.

55. A nuclear magnetic resonance gyro for producing signals representative of the angular displacement of said gyro about a sensing axis comprising:

a nuclear magnetic resonance cell;

a gas or vapor of an optically pumpable substance that possesses a magnetic moment and is capable of being optically pumped, said optically pumpable substance being contained in said cell;

two nuclear moment gases, each having a nuclear magnetic moment, contained in said cell, the nuclear magnetic moments of each said nuclear moment gas being at least partially aligned by collisions of atoms of each said nuclear magnetic moment gas with atoms of said optically pumpable substance to partially transfer said alignment from said substance to each said gas;

means for applying a steady magnetic field to said cell substantially in the direction of a predetermined sensing axis, designated the z axis;

means for illuminating said cell with optical pumping light capable of partially aligning the magnetic moments of said optically pumpable substance in said z direction by absorption of said light, said light having at least a component in the direction of said z axis;

means for applying an AC carrier magnetic field, in the direction of said z axis, to said cell;

means for illuminating said cell with detection light of a wavelength approximately equal to a wavelength which can be absorbed by said optically pumpable substance, said detection light having at least a component perpendicular to said z axis to produce modulations in the intensity of the transmitted part of said detection light substantially at the frequency of at least one harmonic, including the fundamental, of the frequency of said AC carrier magnetic field;

means for precessing said aligned nuclear magnetic moments of each said nuclear moment gas about said z axis at the respective Larmor precession frequencies of each said gas, including means for applying an AC feedback magnetic field at said detected Larmor precession frequencies of each said nuclear moment gas in a direction orthogonal to said z axis and further including means for detecting the phase of said Larmor precession frequencies, said detected phase of said Larmor precession frequencies being used to control the respective phases of said AC feedback magnetic fields substantially in quadrature with the phase of said precessing nuclear magnetic moments of each said gas to cause a sustained precession of said moments of each said gas;

means for detecting modulations in the intensity of the transmitted part of said detection light and for changing said detected modulations into electrical signals;

means for electrically demodulating said modulation signals to obtain signals varying at the Larmor precession frequencies of each of said nuclear moment gases, and a signal varying at the difference between said Larmor precession frequencies, with amplitudes of said signals proportional to the degree of alignment of said nuclear magnetic moments of each said gas;

means for accurately controlling the magnitude and direction of said steady state magnetic field; and means for producing signals which are a measure of angular displacement of said gyroscope about said z axis as changes in phase of the Larmor precession frequency of at least one of said nuclear moment gases.

56. A gyroscope as recited in claim 55 wherein said steady magnetic field has a particular intensity to cause the precession of the magnetic moments of said optically pumpable substance to occur substantially at a harmonic of the frequency of said applied AC carrier magnetic field, including the fundamental frequency thereof.

57. Apparatus recited in claim 56 in which said optically pumpable substance is an alkali metal.

58. The apparatus as recited in claim 56 wherein each said nuclear moment gas is chosen from the class consisting of isotopes of xenon having a nuclear magnetic moment and isotopes of krypton having a nuclear magnetic moment.

59. The apparatus as recited in claim 58 wherein said nuclear moment gases are xenon-129 and krypton-83.

60. The apparatus as recited in claim 56 wherein said detection light is substantially the same wavelength as said optical pumping light.

61. The apparatus as recited in claim 60 wherein said detection light and said optical pumping light originates from the same light source.

62. The apparatus as recited in claim 61 wherein said detection light and said optical pumping light are parallel components of a single beam of light from said light source.

63. The apparatus as recited in claim 61 wherein said detection light and said optical pumping light are not parallel components of a single beam of light from said light source.

64. Apparatus as recited in claim 60 wherein $J_0(\gamma H_1/\omega_c) = J_2(\gamma H_1/\omega_c)$, and $J_0$ is a Bessel function of the first kind of order zero, $J_2$ is a Bessel function of the first kind of order two, $\gamma$ is the gyromagnetic ratio of said pumpable substance, $H_1$ is the AC component of the magnetic field in the direction of the z axis, and $\omega_c$ is the angular frequency of the AC carrier.

65. Apparatus as recited in claim 64 wherein said demodulation means comprises a carrier signal detector receiving signals from said photo detector, signals at said carrier frequency, and signals at twice said carrier frequency to produce a nuclear precession signal and x and y axes magnetic control signals, where the x and y axes are mutually orthogonal axes perpendicular to said z axis, and further comprising a nuclear precession light separator for producing signals at the Larmor precession frequencies of said gases and a signal at the difference frequency between the Larmor precession frequencies of said gases to produce a control signal for said AC magnetic field on said x axis and for controlling increments in the z axis magnetic field.

66. Apparatus as recited in claim 65 and further comprising:
means for generating a signal at the predicted Larmor frequency of one of said gases; and frequency comparator means for receiving signals from said frequency means and said nuclear precession signal separator to produce a signal at a phase which is at the difference phase between said received signals, whereby said last-produced signal is a measure of the angle said gyro has turned about said z axis.

* * * * *

UNITED STATES PATENT AND TRADEMARK OFFICE
CERTIFICATE OF CORRECTION

PATENT NO. : 4,157,495

DATED : June 5, 1979

INVENTOR(S) : BRUCE C. GROVER, EDWARD KANEGSBERG, JOHN C. MARK, ROGER L. MEYER

It is certified that error appears in the above—identified patent and that said Letters Patent is hereby corrected as shown below:

| | |
|---|---|
| Col. 4, | Equation 3 includes two equations, the following equation should be added: $--\omega_b = \gamma_b H - \omega_r --;$ |
| Col. 5, line 43, | change "achivement" to --achievement--; |
| Col. 7, line 36, | after the equation number "(10)" delete "processes"; |
| Col. 7, line 34,36 | change "<" to --≪-- in both equations; |
| Col. 8, line 2, | change "$J_{30}$" to --$J_+$--; |
| Col. 8, line 5, | change "J" to --$J_-$--; |
| Col. 8, line 41, | change "$\omega_a T < 1$" to --$\omega_a T \ll 1$--; |
| Col. 11, lines 31,32, | change the equation to read: $--J_o(\gamma H_1/\omega_c) = J_2(\gamma H_1/\omega_c)--;$ |
| Col. 11, line 52, | change "precission" to --precession--; |
| Col. 12, line 35, | change "n-1" to --n=1--; |
| Col. 15, line 26, | insert --or-- between "gas" and "vapor"; |
| Col. 15, line 47, | change "of" to --for--; |
| Col. 16, line 17 | insert --said-- between "each" and "nuclear"; |

UNITED STATES PATENT AND TRADEMARK OFFICE
CERTIFICATE OF CORRECTION

Page 2 of 2

PATENT NO. : 4,157,495
DATED : June 5, 1979
INVENTOR(S) : BRUCE C. GROVER, EDWARD KANEGSBERG, JOHN G. MARK, ROGER L. MEYER It is certified that error appears in the above—identified patent and that said Letters Patent is hereby corrected as shown below:

Col. 16, line 44, change "processing" to --precessing--;
Col. 16, line 60, change "procession" to --precession--;
Col. 17, line 17, change "pump" to --pumping--;
Col. 18, line 43, change "xenon 129" to --xenon-129--;
Col. 18, line 47, insert --said-- between "of" and "steady";
Col. 19, line 8, change "guadrature" to --quadrature--;
Col. 23, line 11, delete "m";
Col. 25, line 8, change "light" to --signal--.

Signed and Sealed this

Twenty-third Day of June 1981

[SEAL]

Attest:

RENE D. TEGTMEYER

Attesting Officer    Acting Commissioner of Patents and Trademarks